(12) United States Patent
Singleton

(10) Patent No.: US 6,501,949 B1
(45) Date of Patent: Dec. 31, 2002

(54) ACQUISITION OF MOBILE STATION POWER SOURCE CAPACITY LEVELS IN A WIRELESS COMMUNICATIONS NETWORK

(75) Inventor: Frank Singleton, Richardson, TX (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/461,556

(22) Filed: Dec. 14, 1999

(51) Int. Cl.⁷ .................................. H04Q 7/20
(52) U.S. Cl. ............... 455/422; 455/343; 455/572; 455/517; 455/574; 455/522; 455/573
(58) Field of Search ................. 455/422, 426, 455/414, 432, 456, 517, 571, 572, 574, 575, 127, 522, 343, 573

(56) References Cited

U.S. PATENT DOCUMENTS

| | | | | |
|---|---|---|---|---|
| 5,257,406 A | * | 10/1993 | Ito | 455/56.1 |
| 5,870,685 A | * | 2/1999 | Flynn | 455/573 |
| 5,950,124 A | * | 9/1999 | Trompower et al. | 455/422 |
| 6,097,961 A | * | 8/2000 | Alanara et al. | 455/466 |
| 6,131,043 A | * | 10/2000 | Shimizu | 455/561 |
| 6,198,945 B1 | * | 3/2001 | Chen et al. | 455/560 |
| 6,205,333 B1 | * | 3/2001 | Abe | 455/432 |
| 6,230,005 B1 | * | 5/2001 | Le et al. | 455/414 |
| 6,236,852 B1 | * | 5/2001 | Veerasamy et al. | 455/411 |
| 6,275,712 B1 | * | 8/2001 | Gray et al. | 455/522 |

* cited by examiner

Primary Examiner—Edward F. Urban
Assistant Examiner—Marceau Milord

(57) ABSTRACT

A wireless communications network (66) having a plurality of cells (22) and base stations (19), the wireless communications network (66) comprising a mobile station (12) including a power source (50) readable by the mobile station (12). The power source (50) is encoded to provide information about origination and type of the power source (50) to the mobile station (12). Power capacity levels of the power source (50) are measured and also provided to the wireless communications network (66). The network (66) further comprises a switching center (generally the MSC 30) for communicating with the mobile station (12) with the MSC (30) adapted to receive power source (50) information from the mobile station (12). Thus, the wireless communications network (66) may receive information about origination, type, and power capacity levels of the power source (50).

17 Claims, 2 Drawing Sheets

ACQUISITION OF MOBILE STATION POWER SOURCE CAPACITY LEVELS IN A WIRELESS COMMUNICATIONS NETWORK

TECHNICAL FIELD

The present invention relates generally to field of wireless communications and related applications and, more particularly to a system, related communications device and method of acquiring current information about a mobile station in a wireless network including power source type, capacity and remaining life.

BACKGROUND OF THE INVENTION

Wireless communications technology has experienced unprecedented growth, fueled by advances in radio frequency transmission, satellite broadcast systems and microelectronic technologies. Several wireless technologies have emerged and become dominant in the marketplace, including analog systems such as the Advanced Mobile Phone Systems or AMPS, and digital systems such as the Global System for Mobile Communications commonly referred to as GSM, for example. At the same time, the wireless industry is continually evolving and new products and services are constantly being developed to improve the performance of the network and increase the number of features available to the wireless consumer.

A major limitation of the wireless network is the relatively limited life-span of the power supply used to operate the wireless telephone which is referred to in the industry as a mobile station. In general, the batteries used in many common mobile station designs can last from 2 to 8 hours depending on usage, age, discharge rate, temperature, and other factors which influence the life-span of the charge cell. As a result, the user is required to re-charge often and/or replace a defective battery to ensure continued service at a sufficient level of quality.

With the introduction of newer features that drain battery power and slimmer more compact mobile station designs, the need to develop a longer lasting power source becomes more critical. In this regard, the terms "power source", "power supply", "battery", "cell", or "battery pack" can be used interchangeably, either in the singular or plural. For convenience the term "power source" will be used throughout.

The difficulty in designing a better power source is magnified by the fact that many factors are influential in determining power source life-span. Until the present invention, however, the availability of meaningful information about the current status of the mobile station power source was unavailable to the designer and/or engineer faced with the design challenge. Such power source status information would assist in analyzing the life-span of the power source in terms of specific conditions and resulting affects.

To illustrate another need for power source status information, the use of a mobile station in placing an emergency call to a 911 or emergency response unit is one example. At present, positioning of the mobile station has become a requirement and is being implemented to provide assistance in locating a mobile subscriber during an emergency. Knowledge of the available power source capacity at the time the call is placed, however, is currently not available to emergency response personnel. Such information would assist in prioritizing response activity in terms of the life-span of the power source or to encourage such personal to request as much location data as possible from the caller while power is available. If the caller is in climate that restricts or reduces the duration of the power source, the response unit can take that into consideration as part of the response strategy.

Thus, there is a need for a means of acquiring power source status information from the operational mobile station within the service area of the wireless network. A way of identifying current power source type, model and remaining capacity would provide numerous advantages.

SUMMARY OF THE INVENTION

The present invention achieves technical advantages by providing current status information about the power source of a mobile station in the wireless communications network. The information can be utilized for developmental purposes (i.e. improving battery characteristics and capacity) or in instances such as where an emergency call is placed and knowledge about the current capacity of the mobile station power source would assist in responding to the emergency situation.

According to the present invention, disclosed in one embodiment is a mobile station for use in a wireless communications network. The mobile station comprises a power source encoded with origination and type information which can be read by a reader connected to the power source. A meter is connected to the power source and is utilized to measure current power levels of the power source. A messaging means is adapted to process the origination and type information and current power capacity levels of the power source such that the origination and type information and power capacity levels are provided to the wireless communications network.

Also disclosed is a wireless communications network having a plurality of cells and base stations. The wireless communications network comprises a mobile station and a switching center(generally the Mobile Switching Center). The mobile station includes a power source encoded with information readable by the mobile station. The encoded information provides data on the origination, type, and power capacity levels of the power source. The switching center communicates with the mobile station to receive the encoded information from the mobile station. The encoded information and power capacity levels may be downloaded to the switching center real time or at a pre-determined time.

Further disclosed is a method for acquiring power source information from a mobile station encoded with origination and type information comprising the steps of reading the power source origination and type information from the power source and measuring the power level of the power source to obtain power level data. The method also includes processing the origination and type information and the power level data for transmission to the wireless communications network. The origination and type information and the power level data is then transferred to the wireless communications network.

One advantage of the present invention is that it prevents unexpected loss of power and shut downs in critical situations ( i.e. 911 calls).

Another advantage of the present invention is that it provides data for continual development of power source (battery) technology for the ever growing wireless communications products market, particularly mobile phones. Also, locating algorithms can use power source capacity to influence such factors as dynamic power control, and handover criteria.

A further advantage is that the present invention will enable power source performance trending and diagnostics for use in development of higher capacity power sources.

And yet another advantage is that the present invention will allow for real-time remote battery monitoring.

BRIEF DESCRIPTION OF THE DRAWINGS

The above features of the present invention will be more clearly understood from consideration of the following detailed description in connection with accompanying drawings in which.

Corresponding numerals and symbols in the different figures refer to corresponding parts unless otherwise indicated.

DETAILED DESCRIPTION OF PREFERRED EMBODIMENTS

The present invention is a mobile station, such as a wireless telephone, cellular phone, personal communications device or similar wireless terminal, that is configured to provide current status information about its power source to an operations/maintenance node, network manager or other entity in the wireless network. It should be understood, however, that the present invention discloses many innovative concepts and principals which may have application in communications applications not specifically addressed herein.

Figure 1:
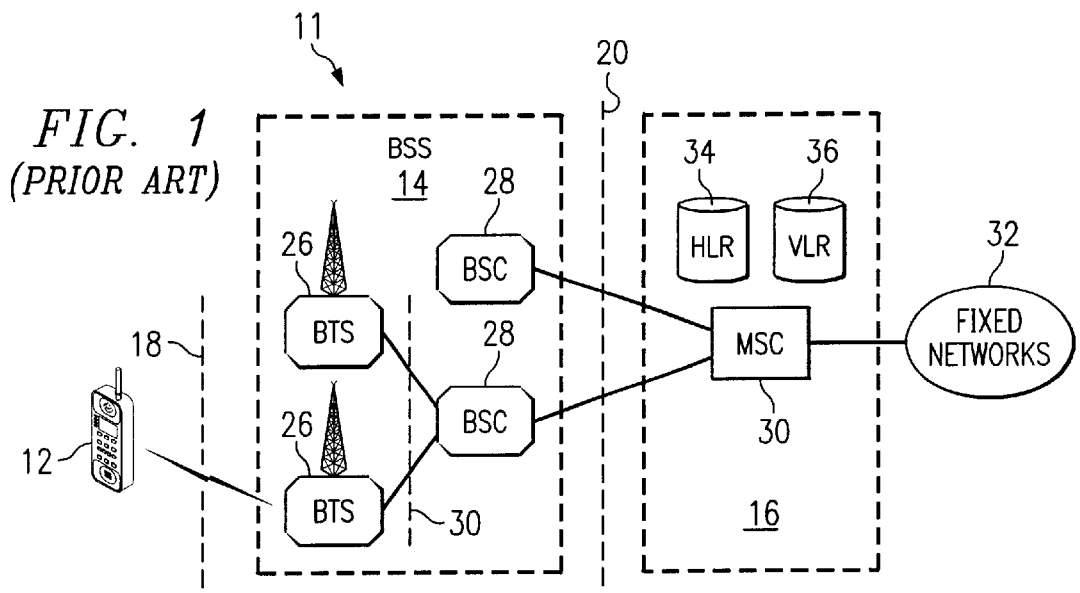
FIG. 1 illustrates a GSM network of the prior art in which the invention can be practiced.

FIG. 1 is a block diagram of a wireless GSM network 11 in which the invention can be practiced, according to one example. The GSM network 11 is comprised of three main parts: a mobile station 12, a Base Station Subsystem (BSS) 14, and network subsystem 16. Mobile station 12 is typically a cellular telephone that is carried by the subscriber, although other terminal devices such as laptops or fax machines may be used to communicate over the GSM network 11. The network subsystem 16, the main part of which is the Mobile Switching Center (MSC) 30, performs the switching of calls between the mobile and other fixed or mobile network users, as well as mobility management. The mobile station 12 and the BSS 14 communicate with one another across the Um interface 18, also known as the air interface or radio link, which is controlled by the BSS 14. The BSS 14 communicates with the MSC 30 of network subsystem 16 across an A-interface 20. The A-interface comprises a distribution sublayer located between the transport upper layer carrying signaling messages. MSC 30 communicates with fixed network 32 which may be the PSTN or other cellular networks, for example.

The signaling protocol of a GSM system generally has three layers. The first layer is the physical layer which uses RF channels over the air interface. The second layer is the data link layer. The third layer has three sub-layers each one handling one of radio resources management, mobility management, or connection management.

The mobile station 12 usually includes a mobile transceiver and a Subscriber Identity Module (SIM). The SIM may include an identity indicator (a "secret" key for authentication), and other relevant network/user information. The mobile transceiver itself is uniquely identified by the International Mobile Equipment Identity (IMEI—typically, a telephone number). The identification features of the MS 12 are independent, thereby allowing mobility of the user about the service area of the GSM network 11.

The BSS 14 typically comprises two parts: the Base Transceiver Station (BTS) 26 (commonly called a base station), and the Base Station Controller (BSC) 28. BTS 26 communicates across a standardized Abis interface 30 with BSC 28, allowing operation between components. BTS 26 houses radio transceivers that communicate across a cell 22, and the BTS 26 handles the radio-link protocols that facilitate communication with the mobile station 12. BSC 28 manages the radio resources for one or more BTSs 26, and, likewise, there may be several BSCs 28 within a single BSS 14. BSC 28 provides a communications platform between the mobile station 12 and the MSC 30 of network subsystem 16 which acts as an interface to one or more fixed networks 32. Among the other functions of the BSC 28 are radio-channel setup, frequency hopping, handovers and locating, among others.

The central component of the network subsystem 16 is the Mobile Switching Center (MSC) 30, which mirrors the performance of a normal switching node of the PSTN, and provides all of the functionality needed to handle mobile subscriber communications, such as registration, authentication, location updating, handovers, and call routing to roaming subscribers. These functions are provided in conjunction with several other network entities.

Figure 2:
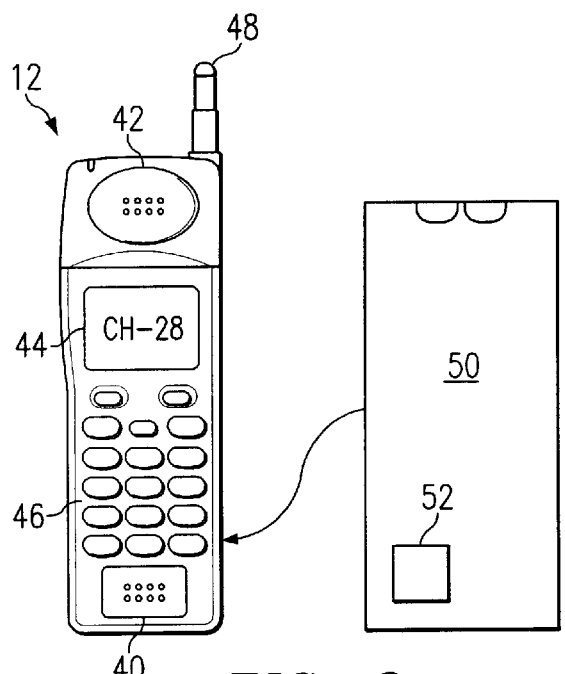
FIG. 2 shows a mobile station equipped to provide current power source information according to the present invention.

The present invention utilizes most of the components of a wireless communications network, such as GSM network 11, with modifications made to the MS 12 to facilitate the transmission of power source information to the network according to the teachings herein. Specifically, a mobile station 12 according to one embodiment of the present invention is shown in FIG. 2. However, it should be appreciated that the mobile station 12 may be another wireless communications device, such as a laptop computer or PCS device.

The mobile station 12 comprises several components: a microphone 40, speaker 42, LCD display 44, keypad 46, and antenna system 48, which allow the user to make a call and talk over the wireless communications network. These components are standard and will generally not require re-design for adaptation in the present invention. The mobile station 12 further comprises a power source 50, generally a battery, which provides the necessary power for the mobile station 12 to operate. While battery housings on mobile phones are standard input designs, some battery designs will have intelligence technology incorporated into them to perform various functions. For instance, some technology will check the charge level to stop or start a mobile phone when the phone is connected to a desktop, car or quick charger and even automatically discharge the battery when necessary. Other technology will provide a metering means by which the power capacity level may be measured. Most intelligence technology is linked to the LCD display 44 to provide a visual indication of battery power capacity in graphical form.

The power source 50 of the present invention will require intelligence technology that will allow the network to acquire the power source 50 capacity levels. The power source 50 capacity will need to be transmitted to the network 10 along with origination and type information. The origination and type information may include time invariant data such as, but not limited to, the power source serial number, manufacturer, date/place of manufacture, listed capacity, and designed voltage. In a mobile station 12, which has processing intelligence, including a means for measuring power capacity levels, the capacity level data needs to be processed and formatted to be transmitted to the wireless communications network 10. In other mobile stations 12 not having resident processing intelligence, a meter (see FIG. 3) would need to be added to thee mobile station 12 to facilitate measuring power capacity levels.

The origination and type information may be obtained by integrating a tag 52 into the power source 50. The tag 52 will contain encoded origination and type information. Encoding of the origination and type information may also take place by programming the mobile station 12 with the power source 50 origination and type information. However, this may limit the types of power sources 50 that may be used in the mobile station 12. Thus, it is more desirable, particularly to mobile phone manufacturers to have a more flexible technology, i.e. the mobile phone can read the origination and type information of any suitable power source 50.

To facilitate a mobile phone that may utilize more than one power source 50, encoding can be accomplished by integrating the tag 52 into the power source 50 at the manufacturer's site. This encoding can be included in the processing intelligence resident in some power sources 50 or it may be a separate processing function that is integrated with the existing processing intelligence. This is particularly true for a power source 50 which does not contain existing intelligent processing capabilities.

Figure 3:
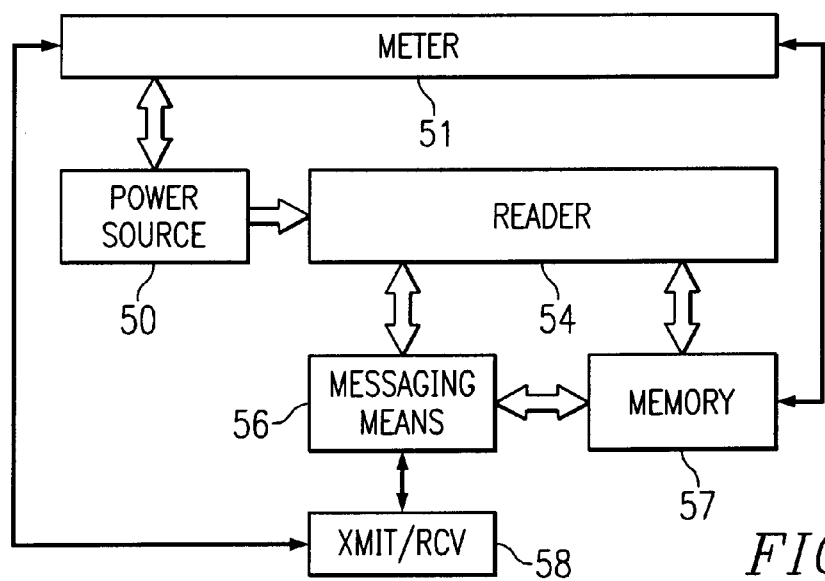
FIG. 3 is a block diagram illustrating the functional components of a mobile station, according to the present invention.

To obtain and process the origination and type information and capacity levels, the mobile station 12 will comprise various components, as shown in the block diagram of FIG. 3. As discussed above, a meter 51 will be connected to the power source 50 to measure current power capacity levels in a mobile station 12 not containing such processing technology. In a mobile station 12 which has resident measuring technology, the measurements can be read by the mobile station 12. A reader 54 is connected to the power source 50 to read the current power capacity level measurements of the meter 51. The reader 54 will also read the origination and type information from the tag 52 connected to or integrated within the power source 50. A messaging means 56 is included and is adapted to process origination and type information and current power capacity levels of the power source 50. Any necessary formatting of the information and capacity level data will be accomplished in the messaging means 56. The data can then be transmitted to the wireless communications network via a transmitter/receiver 58.

In most mobile phones there is a standard transmitter/receiver 58. In GSM phones in particular, a Radio Frequency (RF) unit is resident. This RF unit sends the voice or data information via the mobile station 12 antenna 60 (shown in FIG. 2), over the air and on to the nearest or designated base station 19. The origination and type information and the capacity level data may also be transmitted to the wireless communications network utilizing the RF unit which acts as the transmitter/receiver 58.

Furthermore, the mobile station may comprise a storage means or memory 57 in which the power capacity level data may be stored if necessary. On-board memory 57 is generally standard on mobile phones allowing for storing outgoing telephone numbers and incoming and outgoing messages. This on-board memory 57 may be adapted to include the origination and type information and power capacity level data.

Figure 4:
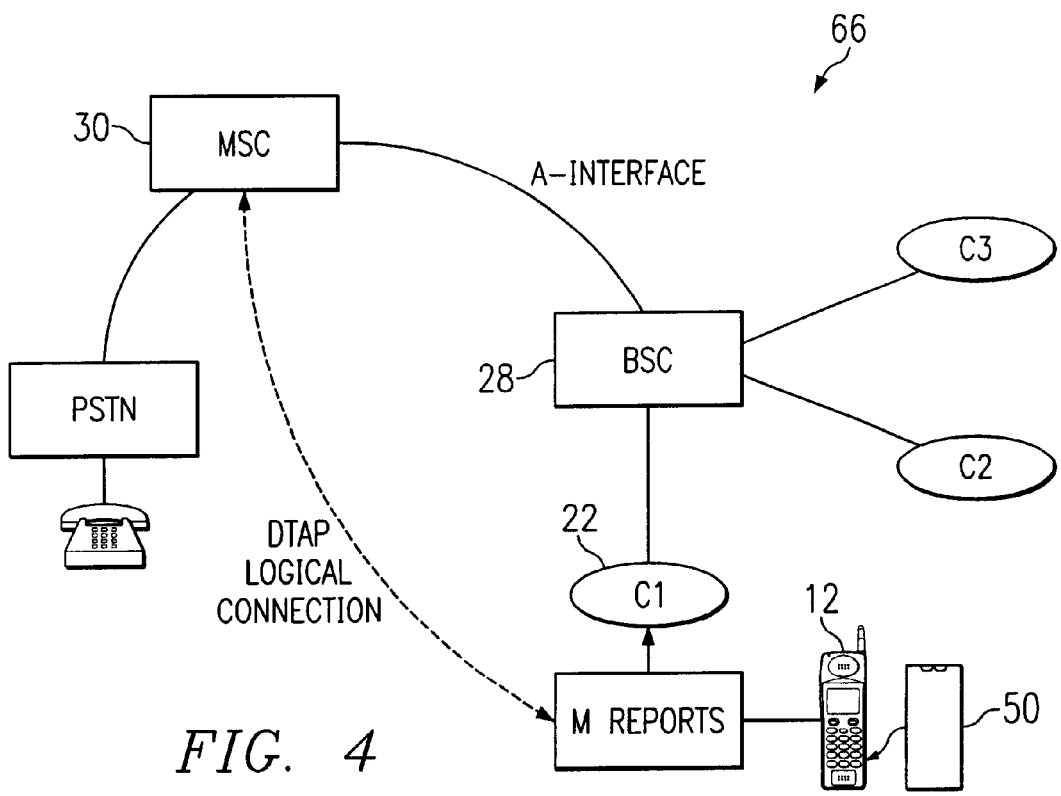
FIG. 4 illustrates the telecommunication network in which the present invention may be practiced.

The origination and type information and capacity level data may be transmitted to the wireless communications network by the transmitter/receiver 58 in several ways. As shown in FIG. 4, the information and data can be appended to the existing measurement reports reported to wireless communications network 66 by the terminal. These measurement reports travel from the mobile station 12 to the BTS 26, to the BSC 28, and then to the MSC 30 utilizing the A-interface. The origination and type information and capacity level data would travel in a like manner to the MSC 30.

Measurement reports include transmission link information including signal strength and Bit Error Rate (BER). The measurement reports are required in most wireless communications networks 66 to report details of the radio environment to the network 66 (BSC 28 or MSC 30) and occur about every 480 ms in a GSM network. The transmission link measurements and locating algorithms are used by the network to determine when it is most suitable for the mobile station 12 in a cell, to be moved (handed over) to a new cell, or to a new timeslot resource, so a call can continue with the best chance of improved signal strength and/or quality (BER). The measurement report can be appended to include an additional layer 3 message in GSM standard for power source 50 capacity level data. This message will be a value or series of values which indicate the power source capacity levels. A message is also included which indicates the origination and type information of the power source 50 corresponding to the power capacity measurements.

Secondly, the information and data can be transmitted separately as a self contained signal. Transmitted in this manner, the information and data can utilize a Direct Transfer Application sub-Part (DTAP) connection in one embodiment. The sub-part DTAP will virtually transfer the information and data directly to the MSC 30.

Figure 5:
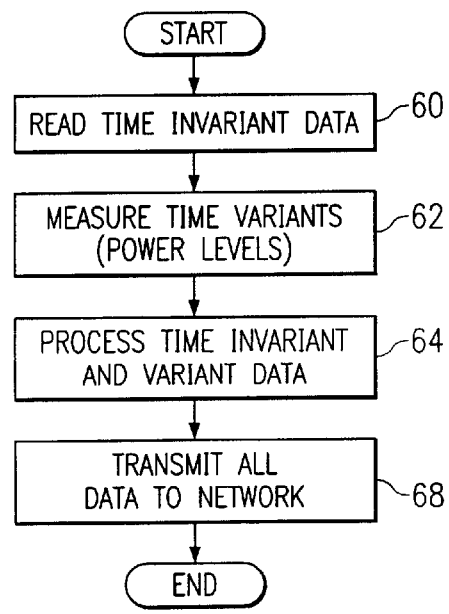
FIG. 5 is a flow chart of the method of the present invention.

A flowchart illustrating a method for acquiring power capacity level data and origination and type information is shown in FIG. 5. The method comprises reading the power source origination and type information from the power source indicated by step 60. At this step the information can be read and stored in memory. At step 62, the power level of the power source is measured to obtain power level data. As represented by step 64, the origination and type information and the power capacity data for transmission to the wireless communications network 66 is then processed. This processing will include any necessary formatting of the data.

The origination and type information and the power capacity data is then transmitted to the wireless communications network 66, represented by step 68. The origination and type information need only be sent once per call establishment or periodically during the call. This allows for the possibility of losing some measurement reports, but still being able to determine the power source information and data. In the embodiment where the information and data is transmitted with the measurement report, the information and data, once received by the network, can be processed along with all the other existing forms of the measurement report to enhance the call processing/supervision for the particular call connection. In another embodiment, the step of reading the origination and type information is performed at the time of transmittal.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, the present invention is discussed as embodied in a GSM mobile phone; however, it is contemplated that another type of mobile phone (i.e. a phone utilizing another type of network) would be suitable for use with the present invention. Also the present invention is discussed with respect to mobile phones, but it should be contemplated that the invention may be embodied in other wireless communications devices. It is therefore intended that the appended claims encompass any such modifications or embodiments.

What is claimed is:

1. A mobile station for use in a wireless communications network comprising:
    a power source encoded with origination and type information;
    a reader connected to said power source, said reader adapted to read said origination and type information;
    a meter connected to said power source, said meter utilized to measure current power capacity levels of said power source;
    a messaging means adapted to process origination and type information and current power levels of said power source; and
    a transmitter and receiver communicably coupled to said messaging means for transmitting to and receiving data from said wireless communications network;
    whereby said origination and type information and power levels are communicated to said wireless communications network by said transmitter and receiver.

2. The mobile station of claim 1 further comprising a storage means connected to said meter whereby current power capacity levels of said power source and origination and type information may be stored for subsequent transmission to said wireless communications network.

3. The mobile station of claim 1 wherein said messaging means further comprises an instruction means providing directions for processing of said origination and type information and current power levels.

4. A wireless network having a plurality of cells and base stations, said wireless communications network comprising:
    a mobile station comprising a power source readable by said mobile station, said power source encoded to provide information about origination, type, and power levels of said power source and comprising a reader connected to said power source, said reader adapted to read origination and type information, a meter connected to said power source, said meter utilized to measure current power levels of said power source, and a messaging means adapted to process origination and type information and current power levels of said power source; and
    a switching center for communicating with said mobile station, said switching center adapted to receive power source information from said mobile station;
    whereby said wireless communications network may receive information about origination, type, and power levels of said power source.

5. The wireless network of claim 4 wherein said origination and type information and power levels of said power source are transmitted from said mobile station to said wireless network in real time.

6. The wireless network of claim 4 wherein said origination and type information and power levels of said power source are encapsulated in measurement reports.

7. The wireless network of claim 4 wherein said origination and type information includes serial number and model number of said power source.

8. The wireless network of claim 4 wherein said origination and type information further includes the name of the power source manufacturer, date and place of manufacturer, listed power capacity, designed voltage, and current-drain specifications.

9. The wireless network of claim 4 wherein said origination and type information and power levels of said power source are transmitted directly to said switching center utilizing a Direct Transfer Application sub-Part (DTAP) connection.

10. The wireless network of claim 4 wherein said origination and type information and power levels of said power source are transmitted to said switching center via said plurality of base stations.

11. The wireless network of claim 4 wherein said encoding is accomplished by programming said mobile station.

12. A method for acquiring power source information from a mobile unit in a wireless communications network, said method comprising:
    reading the power source origination and type information from the mobile unit;
    measuring the voltage and current characteristics of the mobile unit power source to obtain power level data;
    processing the origination and type information and the power level data for transmission to the wireless communications network; and
    transmitting the origination and type information and the power level data to the wireless communications network.

13. The method of claim 12 wherein said step of processing the origination and type information and the power level data further comprises formatting the information and data for transmission to the wireless communications network.

14. The method of claim 12 further comprising the step of initiating a send signal by said wireless communications network whereby said signal is acknowledged by said mobile unit and the information and data are sent to said wireless communications network.

15. The method of claim 12 wherein said step of transmitting the origination and type information and the power level data is performed once during a call connection.

16. The method of claim 12 wherein said step of transmitting the origination and type information and the power level data is performed periodically during a call connection.

17. The method of claim 12 wherein said step of reading the power source origination and type information from the power source further comprises storing said origination and origination and type information in said mobile unit for transmission to said wireless telecommunications network at a subsequent time.

* * * * *